(12) United States Patent
Tracy

(10) Patent No.: US 6,812,049 B1
(45) Date of Patent: Nov. 2, 2004

(54) METHOD AND SYSTEM FOR PERFORMING FAILURE ANALYSIS ON A MULTILAYER SILICON-ON-INSULATOR (SOI) DEVICE

(75) Inventor: Bryan M. Tracy, Oakland, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 44 days.

(21) Appl. No.: 10/313,687

(22) Filed: Dec. 5, 2002

(51) Int. Cl.[7] .................................................. H01L 21/66
(52) U.S. Cl. ........................................... 438/17; 438/14
(58) Field of Search ..................................... 438/14, 17

(56) References Cited

U.S. PATENT DOCUMENTS 5,972,725 A * 10/1999 Wollesen et al. ............. 438/14
6,258,613 B1 * 7/2001 Iwamatsu ..................... 438/18
6,528,335 B2 * 3/2003 Almonte et al. .............. 438/17

* cited by examiner

*Primary Examiner*—John F. Niebling
*Assistant Examiner*—Olivia T. Luk
(74) *Attorney, Agent, or Firm*—Winstead Sechrest & Minick P.C.

(57) ABSTRACT

A method and system for performing backside analysis on a silicon-on-insulator (SOI) device is disclosed. The SOI device includes a silicon layer, a buried oxide layer (BOX), an active layer containing active devices, and multiple metal layers. The method includes opening a window in the silicon layer using the BOX layer as a stop, and using the window as a field of view to view structures in the active layer with a microscope, wherein defects can be detected in the device without delayering any of the metal layers, such that the device remains functional for testing.

10 Claims, 1 Drawing Sheet

METHOD AND SYSTEM FOR PERFORMING FAILURE ANALYSIS ON A MULTILAYER SILICON-ON-INSULATOR (SOI) DEVICE

FIELD OF THE INVENTION

The present invention relates to failure analysis of integrated circuits and more particularly to a method and system of performing failure analysis on multilayer silicon-on-insulator (SOI) devices.

BACKGROUND OF THE INVENTION

Failure analysis is becoming an increasingly important aspect of the fabrication process for integrated circuits. As device geometries become smaller, the probability of defects occurring increases, as well as the deleterious impact the defects have on the device.

One common failure analysis technique is to examine the structures of the integrated circuit device under a scanning electron microscope (SEM) in an attempt to identify structural defects. In most integrated circuits, multiple layers of metal traces are formed over active devices, such as transistors. Using an SEM that normally has an acceleration voltage ranging between 0 and 30 kilovolts, an operator may view device structures that are located three layers deep from the top of the device.

Current submicron microprocessors, however, may have up to nine layers (M1–M6) of copper metallization, and future designs may have many more, perhaps as high as nine to ten layers. Therefore, it is becoming more difficult to examine transistors from the top the device due to the many intervening layers of metal. High-voltage (HV) SEM's that have acceleration voltages up to 200 kilovolts have been commercially available as analytical instruments. Even with the use of HV SEM's, however, defects located six or more layers deep are not visible. In other words, front-side viewing of an integrated circuit device containing 6–9 copper metal layers will fail to reveal defects on layers M3–M1 and on the active device layer.

One approach to overcome this problem is to selectively delayer the device using chemical polishing or wet/dry etching in order to remove the upper layers of metal. Although this approach is effective for some types of devices, delayering is not as effective with copper metallization due to the difficulty in removing copper one layer at a time. Furthermore, delayering ruins the functionality the device and once this type of the failure analysis is performed, the device cannot be powered up for further testing.

Accordingly, what is needed is improved method for performing failure analysis on integrated circuits having multiple layer of copper interconnects.

SUMMARY OF THE INVENTION

The present invention provides a method for performing backside analysis on a silicon-on-insulator device composing a silicon substrate layer, a buried oxide layer (BOX), an active layer containing active devices, and multiple metal layers. The method includes opening a window in the silicon layer using the BOX layer as a stop, and using the window as a field of view to view structures in the active layer with a microscope, wherein defects can be detected in the device without delayering any of the metal layers, such that the device remains functional for testing.

According to the method and system disclosed herein, in the embodiment where HV SEM is used to view the backside of the device, defects may be detected in the device up through layers M3 or M4. In addition, the device structures may be examined without delayering any of the metal layers of the device, such that the device is still essentially functional and could be powered-up during testing to observe device signals as well.

DETAILED DESCRIPTION OF THE INVENTION

The present invention relates to integrated circuit failure analysis. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides improved method and system for performing failure analysis on a multilayer copper integrated circuit. The present invention combines the use of a high-voltage SEM and backside failure analysis for use on silicon-on-insulator (SOI) devices.

Figure 1:
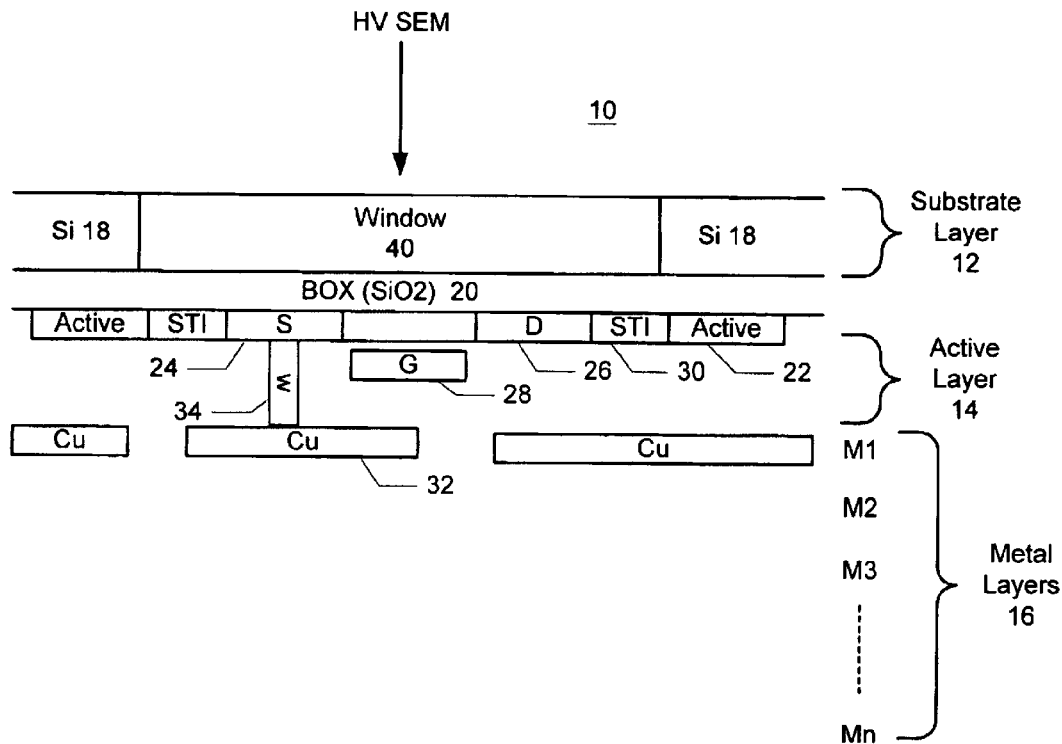
FIG. 1 is an inverted cross-sectional view of a SOI device.

Current integrated circuits, such as microprocessors, are being designed as silicon-on-insulator (SOI) devices. FIG. 1 is an inverted cross-sectional view of a SOI device. An SOI device 10 includes a substrate layer 12, an active layer 14, and multiple metal layers 16, which preferably commonly comprise copper. The substrate layer 12 comprises a thick continuous layer of insulating single crystal silicon (Si) 18, which is covered by a buried oxide (BOX) layer 20 of silicon oxide (SiO2). The active layer 14 over the BOX layers 18 and 20 includes regions of active areas 22 where devices, such as transistors are grown.

As is well known in the art, the active regions 22 include a refractory metal (not shown), which when heated, reacts with silicon to form what is commonly called "silicide." Each transistor formed between the silicided active regions 22 includes a source 24, the drain 26, and gate 28, and shallow trench isolation (STI) areas 30 that separate the transistors. The metal layers 16 includes N layers (M1–Mn) of copper (Cu) interconnects 32 patterned on top of the active layer 14 that form the logic for the device 10. Tungsten (W) plugs 34 connect the active layer 14 to the first metal layer 16.

During fabrication, the device 10 may develop defects, which include silicide shorts, and voids in the copper interconnects 32 of the M1 through M3 layers. During failure analysis, the plugs 34 are generally overlooked. But as device geometries shrink, the width of the plugs 34 becomes narrower, which increases the aspect ratio of the plugs 34. The increased aspect ratios of the plugs 34 increases likelihood of voids forming in tungsten when the plugs 34 are filled. These voids are also defects that need to be discovered during the failure analysis process.

Current front-side failure analysis approaches are incapable of penetrating the upper metal layers in order to examine the critical M3 through active layers using an HV SEM without first delayering some portion of the metal layers 16.

In accordance with the present invention, an HV SEM is used with backside failure analysis on SOI devices to effectively analyze the critical M3–M1 layers and the active layer 14.

Figure 2:
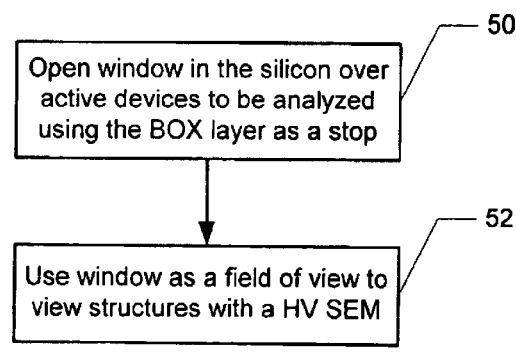
FIG. 2 is a flow chart illustrating the backside failure analysis process for SOI devices in accordance with a preferred embodiment of the present invention.

FIG. 2 is a flow chart illustrating the backside failure analysis process for SOI devices in accordance with a preferred embodiment of the present invention. Referring to both FIGS. 1 and 2, the process begins in step 50 by opening a window 40 in the silicon 18 over the active devices to be analyzed, using the box layer 20 as a stop layer.

Any mechanical or chemical process may be used to remove the silicon 18 to form the window 40. In a preferred embodiment, however, a combination of mechanical and chemical processes is used to remove the silicon 18. First, a mechanical process is used to remove a majority of silicon 28, where the mechanical process is stopped just before the BOX layer 20 is reached. The majority of the silicon 18 may be removed mechanically via grinding or parallel lapping. In grinding, a dimple shape is ground into the silicon layer on the back of a given specimen. In parallel lapping, a course abrasive step is used to remove most of the silicon 18 in a planar fashion, rather than in a dimple shape. The coarse abrasive step is followed by a finer abrasive step.

The mechanical process is then followed by a wet etch to remove the remaining silicon 18, where the wet etch uses the silicon etching characteristics of the BOX layer 20 as a stop. The wet chemical etch may be performed with a variety of materials that remove silicon 18, but not SiO2, such as TMAH (tetramethylammonium hydroxide), HF+nitric acid, and potassium hydroxide (KOH). Where parallel lapping is used, the abrasive steps may be followed by a careful polish to remove the remainder of the silicon 18 in the window, rather than chemical etching.

In step 52, after the window 40 is formed, the window 40 is used as a field of view to view structures in the active regions, e.g., the transistors, metal interconnects 32, and plugs 34 with a microscope to detect defects in the device. When examining the device with a HV SEM, the defects that may be detected include silicide shorts, plug voids, and metal layer 16 voids.

In a preferred embodiment, an HV SEM operating at approximately 120 KV or more is favored over an optical microscope, due to the higher penetrating power of the HV SEM. However, an optical microscope may also be used. Existing commercial HV SEM are available that may be adapted to the geometry of the SOI device 10, such as the Hitachi HD2000 and the JEOL 1200. The choice of which HV SEM to use is based on a trade-off between resolution and specimen size. For example, the Hitachi HD2000 examines a limited sample size, but has higher resolution, whereas JEOL 1200 has a large specimen chamber capable of holding a whole wafer, but has less resolution.

According to the present invention, in the embodiment where HV SEM is used to view the backside of the device, defects may be detected in the device up through M3 or M4. In addition, the device structures may be examined without delayering any of the metal layers 16 of the device, meaning that the device is still essentially functional and could be powered-up during testing to observe device signals as well.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for performing backside analysis on a silicon-on-insulator device comprising a silicon layer, a buried oxide layer (BOX), an active layer containing active devices, and multiple metal layers, the method comprising the steps of:
   (a) opening a window in the silicon layer using the BOX layer as a stop; and
   (b) using the window as a field of view to view structures in the active layer with an HV SEM microscope, wherein defects can be detected in the device without delayering any of the metal layers, such that the device remains functional for testing.

2. The method of claim 1 wherein the SOI device includes more than six metal layers.

3. The method of claim 1 wherein step (a) further includes the step of:
   (i) using a combination of mechanical and chemical processes to remove the silicon.

4. The method of claim 3 wherein step (a) further includes the step of:
   (ii) using a mechanical process to remove a majority of silicon, leaving a remaining portion of silicon over the BOX layer; and
   (iii) using a wet etch to remove the remaining portion of silicon, where the silicon etching characteristics of the wet etch uses the oxide chemistry of the BOX layer as a stop.

5. The method of claim 4 wherein step (a) further includes the step of:
removing the majority of the silicon using grinding.

6. The method of claim 4 wherein step (a) further includes the step of:
removing the majority of the silicon using parallel lapping.

7. The method of claim 3 wherein step (a) further includes the step of:
performing the wet chemical etch with materials that remove silicon, but not the BOX layer, wherein the BOX layer comprises SiO2.

8. The method of claim 3 wherein step (a) further includes the step of:
performing the wet etch with TMAH (tetramethylammonium hydroxide).

9. The method of claim 3 wherein step (a) further includes the step of:
performing the wet etch with HF+nitric acid.

10. The method of claim 3 wherein step (a) further includes the step of:
performing the wet etch with potassium hydroxide (KOH).

* * * * *